United States Patent
Samal et al.

(10) Patent No.: US 12,237,327 B2
(45) Date of Patent: Feb. 25, 2025

(54) VARIABLE WIDTH FOR RF NEIGHBORING STACKS

(71) Applicant: pSemi Corporation, San Diego, CA (US)

(72) Inventors: Shashi Samal, San Diego, CA (US); Matt Allison, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 101 days.

(21) Appl. No.: 17/523,816

(22) Filed: Nov. 10, 2021

(65) Prior Publication Data

US 2023/0142322 A1    May 11, 2023

(51) Int. Cl.
*H01L 27/085* (2006.01)
*H01L 21/822* (2006.01)
*H01L 27/02* (2006.01)

(52) U.S. Cl.
CPC ........ *H01L 27/085* (2013.01); *H01L 21/8221* (2013.01); *H01L 27/0207* (2013.01)

(58) Field of Classification Search
CPC ............... H01L 27/085; H01L 21/8221; H01L 27/0207; H01L 21/823412; H01L 27/088; H01L 27/0688
USPC ...................................................... 257/286
See application file for complete search history.

(56) References Cited

U.S. PATENT DOCUMENTS

| | | |
|---|---|---|
| 6,804,502 B2 | 10/2004 | Burgener et al. |
| 7,960,772 B2 | 6/2011 | Englekirk |
| 9,948,281 B2 * | 4/2018 | Ranta .................. H03J 3/16 |
| 10,404,252 B2 | 9/2019 | Seki |
| 2003/0090313 A1 * | 5/2003 | Burgener ............ H03K 17/063 327/408 |
| 2008/0265978 A1 * | 10/2008 | Englekirk ............ H03K 17/161 327/427 |
| 2011/0002080 A1 * | 1/2011 | Ranta ................ H01L 27/0629 361/277 |
| 2015/0280655 A1 | 10/2015 | Nobbe et al. |
| 2015/0311883 A1 * | 10/2015 | Bakalski ............... H03H 11/28 334/55 |
| 2018/0166392 A1 * | 6/2018 | Yamazaki .......... H01L 27/0688 |
| 2018/0248010 A1 * | 8/2018 | Endo ................ H01L 27/1288 |
| 2020/0051973 A1 * | 2/2020 | Shapiro .................. H01L 29/93 |
| 2020/0280312 A1 * | 9/2020 | Englekirk ............. H01H 11/00 |
| 2021/0258009 A1 | 8/2021 | Englekirk |

FOREIGN PATENT DOCUMENTS

| | | | |
|---|---|---|---|
| JP | 2008182388 A | | 8/2008 |
| JP | 2013077959 | * | 4/2013 |
| KR | 101630019 B1 | | 6/2016 |
| WO | 2008/133621 A1 | | 11/2008 |

OTHER PUBLICATIONS

International Search Report and Written Opinion for International Application No. PCT/US2022/079464 filed on Nov. 8, 2022 on behalf of PSEMI CORPORATION Mail Date: Mar. 16, 2023 10 pages.

* cited by examiner

*Primary Examiner* — Duy T Nguyen
(74) *Attorney, Agent, or Firm* — Steinfl + Bruno LLP

(57) ABSTRACT

Devices and methods to manufacture a stack of FET switches in presence of a neighboring stack of FET switches are described. The stack of FET switches is designed or manufactured so that at least its top FET has a width that is smaller than the width of its bottom FET. Other voltage handling configurations and distributions of widths are described.

18 Claims, 4 Drawing Sheets

US 12,237,327 B2

VARIABLE WIDTH FOR RF NEIGHBORING STACKS

FIELD

The present disclosure relates to integrated circuit devices, and more particularly to methods and apparatus for handling voltage distribution in RF switch stacks when in presence of a neighboring stack.

BACKGROUND

As shown in FIG. 1, voltage distribution across FETs in a switch stack (such as the one shown in, e.g., U.S. Pat. No. 6,804,502, incorporated herein by reference in its entirety) is not uniform. The top FET (FET #32 in the figure) generally experiences a larger proportion of the total applied switch voltage than any other FET in the stack. As a consequence, such most heavily stressed FET has the tendency to fail first, leading to failure of the other FETs in a domino-like effect. Such voltage distribution inequalities are generally caused by parasitic capacitances. A known method to address this issue is to make the transistors of the stack progressively larger from bottom to top, either in lieu of, or in addition to, adding discrete capacitance between the transistors of the stack. Reference to capacitive compensation in FET switch stacks can be made, for example, to PCT published application WO 2008/133621, incorporated herein by reference in its entirety.

SUMMARY

The present application describes a novel apparatus and method for handling voltage distribution in RF switch stacks when in presence of a neighboring stack, as described in detail in the following figures.

According to a first aspect, an integrated circuit is provided, comprising a first stack comprising stacked FETs proceeding from a bottom FET of the first stack to a top FET of the first stack; and a second stack comprising stacked FETs proceeding from a bottom FET of the second switch stack to a top FET of the second stack, the second stack neighboring the first stack, wherein each FET of the first stack or the second stack has a FET width extending in a top-to-bottom or bottom-to-top direction of the first stack or the second stack, and the FET width of the top FET of the first stack is smaller than the FET width of the bottom FET of the first stack.

According to a second aspect, an integrated circuit is provided, comprising a first stack comprising stacked FETs proceeding from a bottom FET of the first stack to a top FET of the first stack; and a second stack comprising stacked FETs proceeding from a bottom FET of the second switch stack to a top FET of the second stack, the second stack neighboring the first stack, wherein each FET of the first stack or the second stack has a FET width extending in a top-to-bottom or bottom-to-top direction of the first stack or the second stack, and the FET width of the top FET of the first stack is smaller than the FET width of at least a first lower FET of the first stack.

According to a third aspect, a method to handle voltage imbalance in a stack of FETs is provided, comprising: forming a stack of FETs comprising stacked FETs proceeding from a bottom FET of the stack to a top FET of the stack, each FET of the stack having a FET width extending in a top-to-bottom direction of the stack, wherein the top FET of the stack of FETs has a FET width smaller than the FET width of the bottom FET of the stack of FETs; and placing the stack of FETs close to a neighboring stack of FETs in a same integrated circuit.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 3 shows voltage distributions in FETs of a left stack with fingers of constant width when the right stack in ON or OFF.

DETAILED DESCRIPTION

The present disclosure addresses the behavior of FET switch stacks in presence of neighboring FET switch stacks comprising a plurality of FETs stacked on top of each other in a source to drain arrangement. By way of example, shunt switches (37) and (38) of FIG. 3 of the above mentioned U.S. Pat. No. 6,804,502, showing a single pole single throw (SPST) switch, can be placed close to each other on the same chip die.

Two FET switch stacks are "neighboring" when they are in close proximity to each other to exert a sufficient coplanar parasitic capacitance as to influence the voltage division of one or both of the two FET switches under design.

Figure 2:
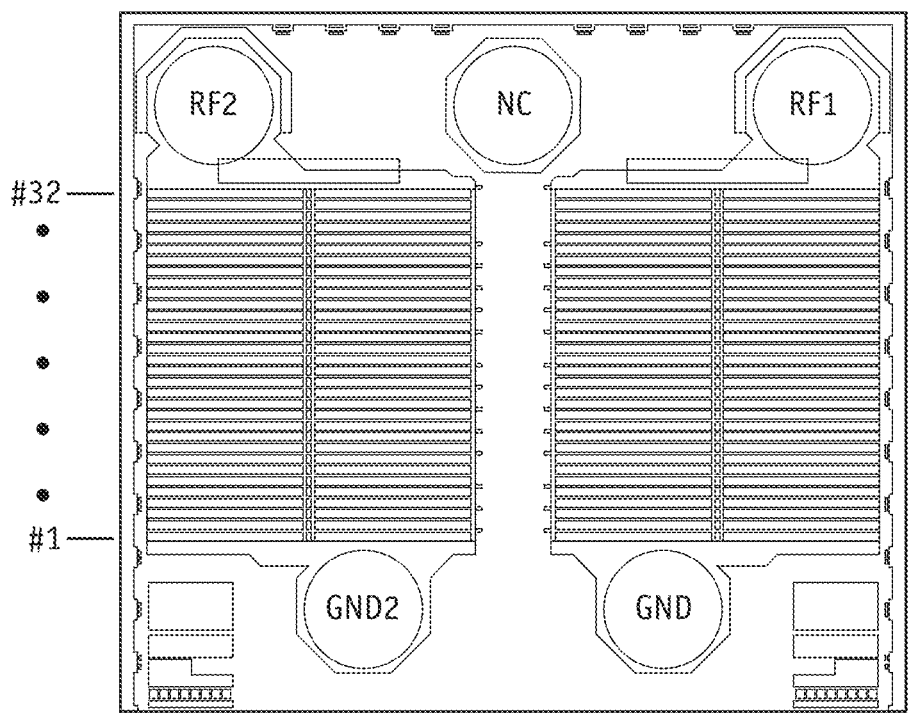
FIG. 2 shows a schematic representation of two neighboring switch stacks, each having fingers of a same width.

An exemplary schematic configuration of two neighboring FET switch stacks is shown in FIG. 2, where each FET of the stacks is represented as a device having a finger-like configuration, with two branches per FET shown, each with multiple vertical, north-south, fingers, for the purpose of clarity. In particular, FIG. 2 shows thirty-two FETs per switch stack, conventionally numbered in ascending order from top to bottom (FET #1 being the bottom FET and FET #32 being the top FET), each FET finger having a constant width w (vertical, north-south, dimension of each finger in the figure) of, e.g., 14 um.

Figure 3:
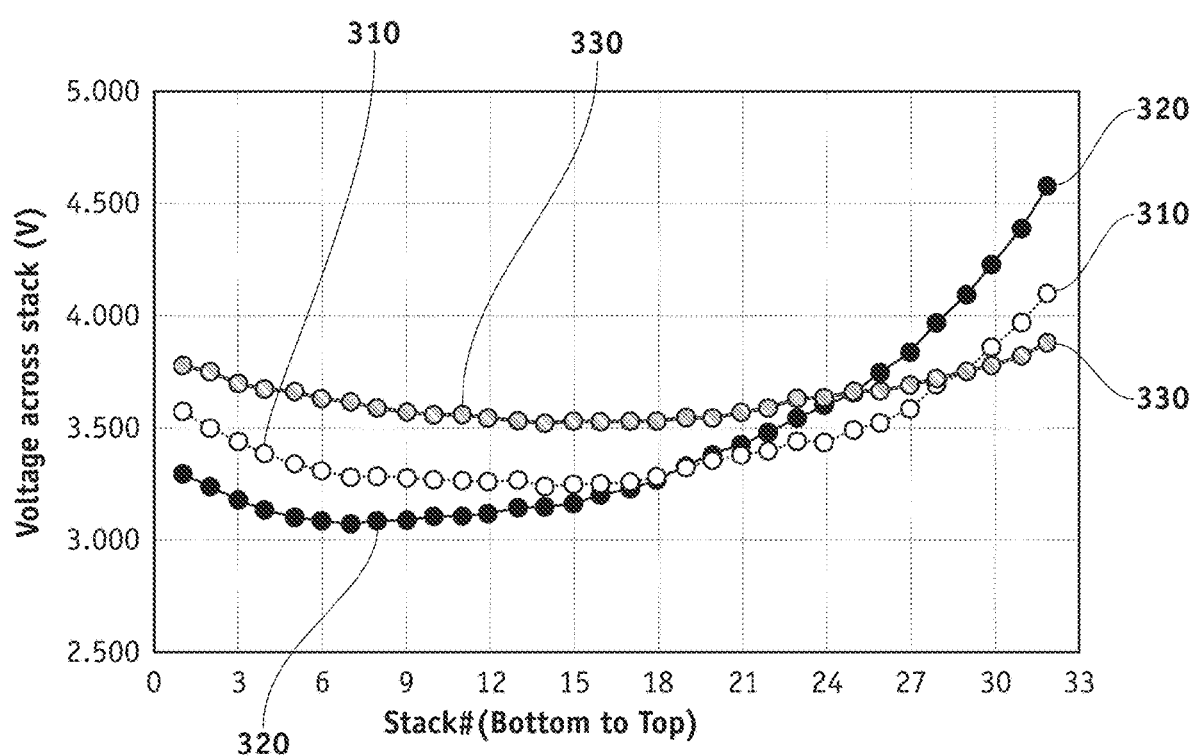
FIG. 3 shows

Faced with the issue of neighboring switch stacks, the inventors have performed an evaluation of voltage distribution of the left switch stack of FIG. 2 under two different conditions of the right, neighboring, switch stack, i.e. right switch stack ON and right switch stack OFF under 110V peak RF signal with stacks of 32 FETs each, for which the voltage across the terminals of each FET should ideally be 110/32 V=about 3.5V. The observed voltage distribution is shown in FIG. 3 and brings to the relevant discovery that voltage distribution of the FETs of the left switch stack is a function of the ON/OFF status of the right switch stack. The same effect occurs on the right stack as a function of the ON/OFF status of the left switch stack. The present disclosure will provide a description relative to the left switch stack, with the understanding that its teachings can be applied to both the left and right stack, thereby accruing the resulting benefits to both switch stacks.

Figure 1:
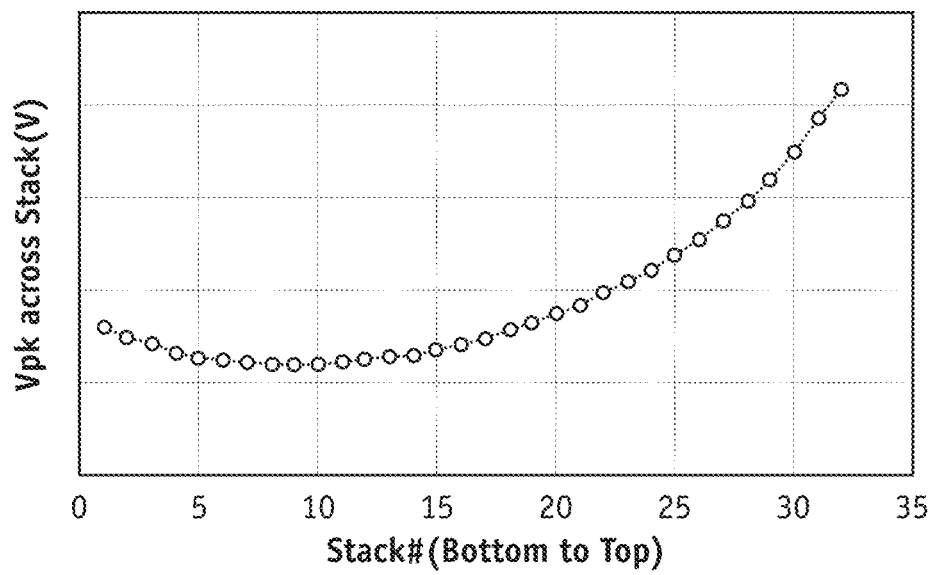
FIG. 1 shows a prior art voltage distribution across FETs in a switch stack.

In particular, curve (310) in FIG. 3 shows voltage distribution in the FETs of the left stack when the right stack in ON, while curve (320) shows voltage distribution in the FETs of the left stack when the right stack is OFF. While both voltage distributions have a behavior that is similar to the behavior of the distribution shown in FIG. 1, the OFF condition of the right switch stack has undesired consequences on the voltage distribution of the left switch stack when compared to the ON condition of the right switch stack. First of all, the variance of the voltage distribution on the left switch stack is much higher when the right switch stack is in an OFF condition. Additionally, the upper FETs in the left switch stack experience much higher voltages across their terminals in the OFF condition of the neighboring stack when compared with its ON condition. This difference is especially seen in the upper FET of the left stack (#32) where a voltage of about 4.6V (compared with a voltage of about 4.1V in the ON condition of the right stack) can be observed. FIG. 3 also shows a third curve (330) which represents the drain-to-source breakdown voltage (BV) of each constituent FET of the left stack under ideal conditions. It can be readily seen how in the OFF condition of the right, neighboring, stack not only more FETs of the left stack will experience a voltage above BV but also such voltage will be much higher than a corresponding voltage when the neighboring stack is the ON condition.

While each FET stack exhibits known parasitic capacitances to a ground plane below the stack (e.g. through a buried oxide layer in a conventional silicon-on-insulator, SOI, fabrication process), called Cpgnd throughout the present disclosure, the inventors have observed that the close distance of the two stacks also adds a coplanar parasitic capacitance between neighbors, named Cpnbr throughout the present disclosure, that behaves differently from Cpgnd.

Considering, for example, FET #32 of the left stack, such FET has i) a coplanar capacitance to its neighboring FET #32 on the right stack, as well as ii) a coplanar capacitance to all the other FETs in the right stack. With the fingers running north-south, the parasitic capacitance to a neighboring equivalent FET (FETs #32 in the case at issue) is proportional to the width of the finger. In addition, also Cpgnd is proportional to the finger width.

Parallel plate capacitors behave differently from coplanar capacitors. The former exhibits a capacitance $C=\epsilon A/d$ while the latter exhibits a capacitance C proportional to $\ln(W/S)$ where W is the width of each coplanar plate and S is their lateral separation.

Looking again at FIG. 3, it can be noted that by turning ON the neighboring switch, voltage division across the left stack is improved as compared to turning OFF the neighboring switch. Specifically, as already noted above, FIG. 3 shows a reduction of almost 0.5 V for FET #32 with its neighbor ON and therefore more voltage is dropped across the lower FETs. In other words, a neighboring ON FET provides significant capacitive compensation to the upper FETs of the left stack at the expense of the lower FETs by its very presence.

Reference will now be made to the schematic representations of FIGS. 4 and 5 which will provide a qualitative explanation of the capacitive effect of the right stack on the left stack.

Figure 4:
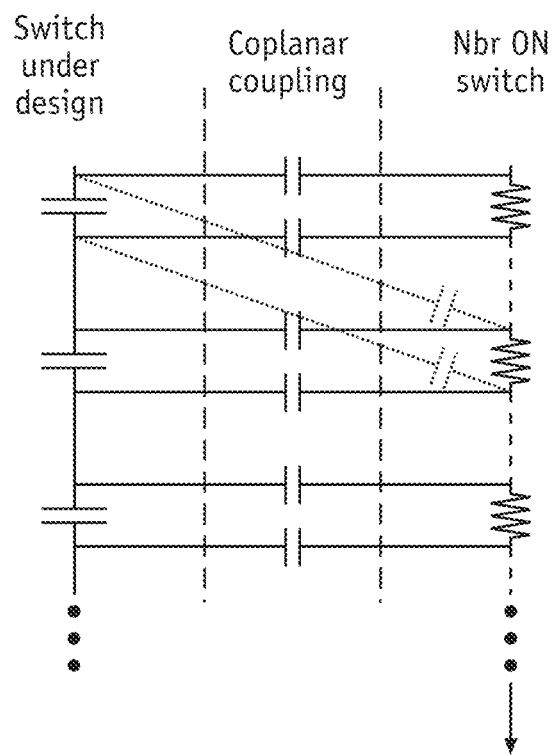
FIGS. 4 and 5 show a qualitative explanation of the capacitive effect of the right stack of FIG. 2 on the left stack of FIG. 2.

Starting with FIG. 4, which shows the right stack in an ON condition (right FETs represented through their Ron resistances), FET #32 of the left stack experiences coplanar capacitance to its equivalent FET in the right stack (see top horizontal capacitance in the figure) as well as coplanar capacitance to the lower FETs in the right stack, as schematically shown in the figure by way of inclined capacitances. Due to the Ron resistance of each ON FET of the right stack, the coplanar capacitance is most effective to the higher FETs of the left stack in terms of capacitive compensation. For the lower FETs of the left stack, the series resistance to ground becomes low enough that the coplanar capacitance to the lower FETs begins to add capacitance to ground, thus worsening the capacitive compensation effect. Therefore, the presence of coplanar capacitance has a beneficial capacitive compensation effect for higher FETs and a worsening compensation effect for lower FETs. This is confirmed by the diagram of FIG. 3, which shows an improvement of about 0.5 V for the upper FETs and a degradation of about 0.25 V for the lower FETs.

Apart from the coplanar capacitance between the right stack and the left stack under design (horizontal and inclined capacitances shown in FIG. 4) there is also a "vertical" coplanar capacitance component from the top to the lowest FETs in the neighboring stack. Due to the $\ln(W/S)$ nature of such capacitance, the "vertical" coplanar capacitance from the top FET to the lowest FETs in the neighboring stack is smaller due to the larger value of S, thereby increasing the relative impact of the top "horizontal" coplanar capacitance. This effectively puts the coplanar capacitance in parallel with FET #32 of the neighboring stack, improving its capacitive compensation and voltage handling while putting the coplanar capacitance for lower FETs to ground, thereby degrading the voltage handling capabilities of such FETs.

In particular, neighboring FET #32 provides capacitive compensation to FET #32 of the left stack, with a result just as seen in FIG. 3, i.e., reduced voltage across FET #32 when its neighbor is ON as compared to when its neighbor is OFF. For lower FETs in the left stack, the RC time constant difference becomes less, and the neighbor ON FETs begin to act more like they have a true GND connection rather than a parallel S/D capacitance connection, thereby reducing their capacitive compensation effect at lower FETs of the left stack, and eventually adding to Cpgnd. This has the effect of increasing the voltage on the lower FETs of the left stack, again just as seen in FIG. 3.

Therefore, due to the difference in behavior between the parallel plate parasitic capacitance to the ground plane, Cpgnd, and the coplanar parasitic capacitance, Cpnbr, along with the changing RC time constant to ground, neighbor switch stacks provide substantial capacitive compensation to each other, and they naturally increase compensating capacitance at the top of the stack and increase parasitic capacitance to ground at the bottom of the stack.

Figure 5:
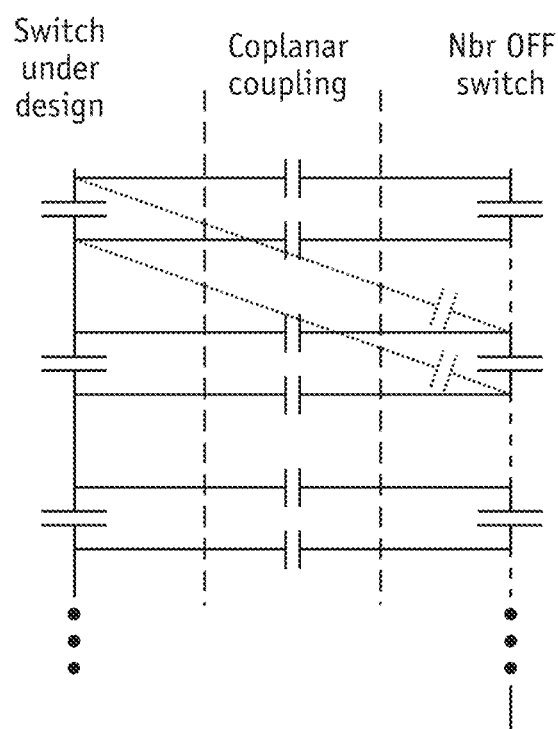

Turning now to the schematic representation of FIG. 5, the neighboring stack is OFF and the top horizontal coplanar parasitic capacitance is reduced due to being in series with the Coff capacitance of the top FET of the neighboring stack. This effect also holds for all the Coff capacitances of each OFF FET in the neighboring stack. In other words, the coplanar parasitic capacitance of the neighboring stack in an OFF condition is still present but it is reduced as compared to the previous ON case. Also in this case the effect is greatest at the top of the stack due to a larger number (31 for FET #32) of Coff capacitances in series to ground. This means that there is a reduced capacitive coupling effect of the neighboring FETs on each other when compared with the OFF condition of the neighboring stack.

In other words, in the OFF case, i) Cpgnd dominates, ii) there is reduced Cpnbr capacitive compensation, and therefore iii) a higher voltage drop across FETs at the top of the left stack. In summary, the ON condition of the neighboring stack has a beneficial capacitive compensation effect, while an OFF condition reduces such effect.

However, as shown in FIG. 2, the OFF condition of the neighboring stack exceeds the FET BV values by more than 0.5 V and the ON condition of the neighboring stack still exceeds BV by about 0.2 V. In both cases, such a design would fail.

The above observations can be applied when devising devices and methods to improve voltage handling and division in switch stack under design like, for example, the left switch stack shown in the above figures. While traditional capacitive compensation (adding more capacitance to the top FETs) can be used, such solution consumes area and adds complexity and cost.

In view of the above observations and problem to be solved, the approach to be followed in designing the stack on the left side, when in presence of a neighboring stack, should i) on one side maximize the stack's ability to divide the applied RF voltage (e.g. 110V peak RF voltage) as evenly as possible and, on the other side ii) be a compromise between the ON and OFF conditions of the neighboring switch stack and iii) ensure that all FETs of the left stack operate below their breakdown limit (i.e. below curve (330) in FIG. 3) in both conditions of the right switch stack, given that in most applications (e.g. dual SPST switch) a neighboring switch stack can be ON or OFF independently of the state of the left switch stack. The current disclosure provides a solution that leverages the capacitive compensation mechanism of the neighboring ON/OFF FETs as described above.

Figure 6:
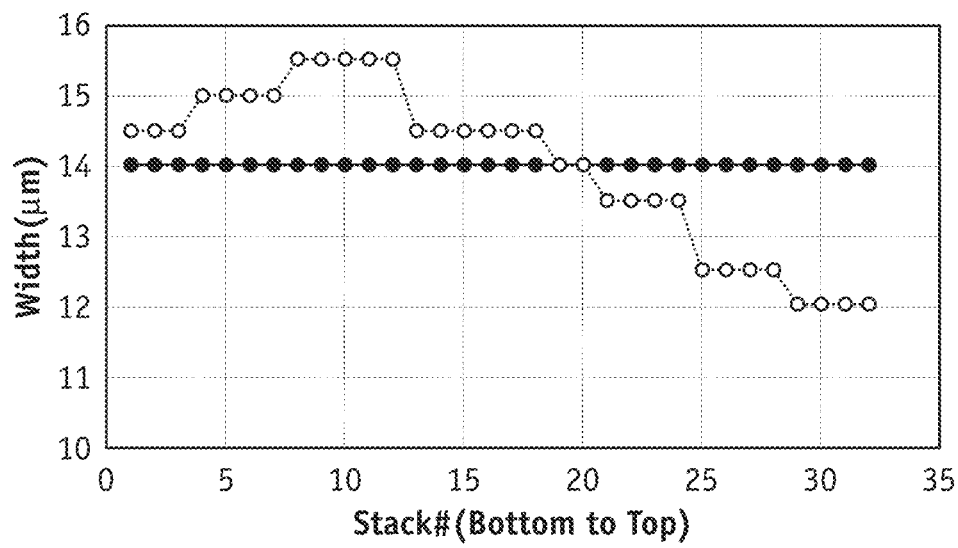
FIG. 6 shows an embodiment of the present disclosure where a method to design the left stack includes reducing the width of the top FETs and increasing the width of the bottom FETs.
Figure 7:
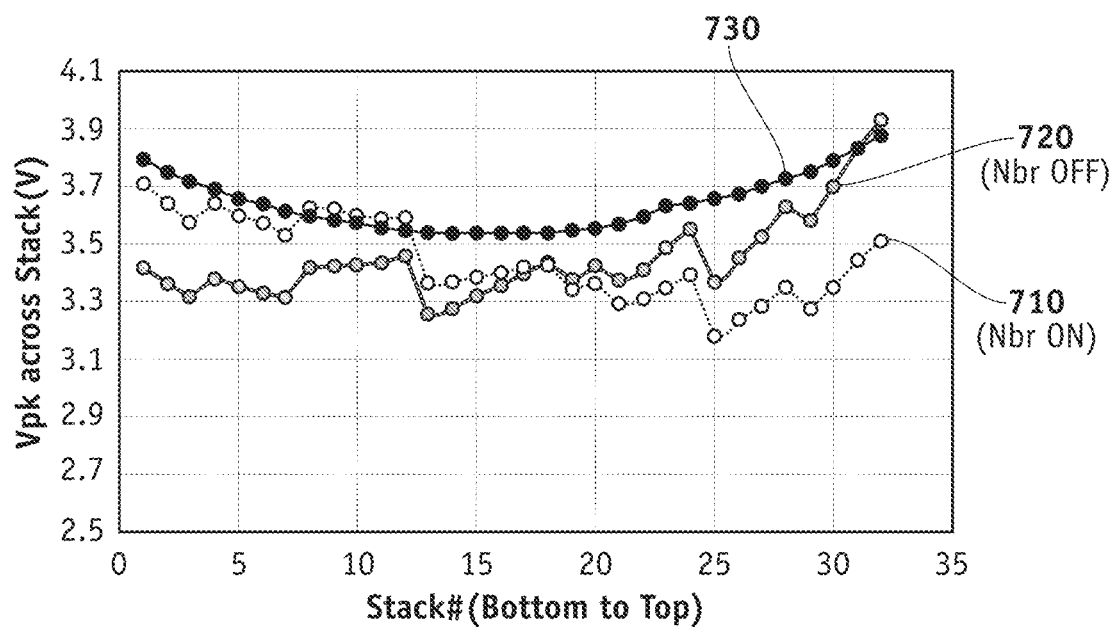
FIG. 7 shows voltage distributions in FETs having widths adjusted according to FIG. 6 when the right stack is ON or OFF.

Reference will now be made to FIGS. 6 and 7. FIG. 6 shows an embodiment of the present disclosure where a method to design the left stack includes reducing the width of the top FETs and increasing the width of the bottom FETs. As shown in FIG. 7, by adjusting the width, w, of different FETs within a stack of FETs under design, all FETs can be made to operate below their BV target. In the example embodiment shown in FIG. 6, the total width W of the FETs (when compared with a total width W of 14 um×32 originated from constituents FETs all having the same individual width w) is conserved with FET fingers of different widths and no additional capacitors are needed to provide sufficient capacitive compensation. Elimination of such additional capacitors is advantageous because it may save area, complexity and cost.

As shown in FIG. 7, by increasing the width of the bottom FETs and decreasing the width of the top FETs (as previously shown in FIG. 6), the FET stack under design achieves the desired voltage handling capability under both ON (curve 710) and OFF (curve 720) conditions. The exemplary profile shown in FIG. 6 takes advantage of the different effects of coplanar capacitance to a neighboring FET stack, i.e., that the upper FETs experience a positive capacitive compensation effect while the lower FETs experience a negative capacitive compensation effect. Hence, by making the lower FETs wider, they see additional capacitance to ground, Cpgnd, and the associated negative capacitive compensation effect from Cpnbr. These lower FETs therefore absorb more voltage division as desired. The opposite combination occurs for reducing the width w of the upper FETs, in that their Cpgnd is reduced while they maintain the beneficial capacitive compensation effect of their Cpnbr. It is pointed out here that the traditional capacitive compensation techniques, where the width of the top FETs is increased instead of being reduced, teach away from the solution according to the present disclosure.

As the lower FETs handle more voltage, the upper FETs must shed that voltage. Turning back to the embodiment shown in FIG. 6, at around FETs 8-12, the maximum w is seen (15.5 um in the embodiment of the figure), which has the effect of maximizing the negative capacitive compensation effect of the neighboring stack as can be seen in the relative increase in voltage for FETs 8-12, shown in FIG. 7, under both ON and OFF conditions of the neighboring stack.

The widths shown in FIG. 6 result in the voltage drops shown in FIG. 7 as compared to FIG. 3: voltage on FET #8 is increased from 3.3 V to 3.6 V for neighboring stack ON and from 3.1 to 3.4 for FET #8 for neighboring stack OFF. The net result is that all FETs are at or below (within 50 mV) BV (see curve (730) of FIG. 7) for both ON and OFF conditions of the neighboring stack.

If desired, additional more granular adjustments to the w of each FET of the stack under design can further adjust or smooth the response and/or compensate for the final 50 mV needed to meet all BV requirements shown in FIG. 7. Moreover, the changes in the w's can be chosen to be different than those shown in FIG. 6, while still following the general teaching of making the upper FETs narrower and the mid/lower FETs wider.

In particular, the teachings of the distribution of FIG. 6 of width adjustments to the switch stack under design can also be seen from a more general point of view than the exact distribution amounts shown in the figure. For example, according to an additional embodiment of the disclosure, each FET of the top third FETs in the stack can be configured to have a width that is smaller/narrower than the width of each FET in the bottom third of the stack. According to a further embodiment, the width distribution in the top half (see e.g. FETs #17-32 in FIG. 6) of the stack can be configured to be a non-decreasing width distribution in a top-to-bottom direction, with at least one of the FETs of the top half of the stack (e.g. FET #25) having a width smaller than another, lower, FET (e.g. FET #20) in the same top half of the stack. According to yet another embodiment, the bottom half of the stack (see e.g. FETs #1-16 in FIG. 6) can be characterized by an upper set of FETs (see e.g. FETs #8-16 in FIG. 6) and a lower set of FETs (see e.g. FETs #1-7 in FIG. 6), where the FETs of the upper set of the bottom half have a non-decreasing width distribution in a top-to-bottom direction, with at least one of the FETs of the upper set of the bottom half (e.g. FET #15) having a width smaller than another, lower, FET (e.g. FET #10) in the same upper set of the bottom half. On the other hand, the FETs of the lower set of the bottom half can be configured to have a non-increasing width distribution in a top-to-bottom direction, with at least one of the FETs of the lower set of the bottom half (e.g. FET #7) having a width larger than another, lower, FET (e.g. FET #3) in the same lower set of the bottom half. Additional, more generalized, less generalized or differently generalized, embodiments can be devised upon observation of the width distribution shown in FIG. 6. Additionally, although FIG. 6 shows widths arranged in clusters or sets of widths (e.g. same width for FETs #8-12), alternative embodiments with a smoother profile are possible, where fewer clusters, clusters with fewer FETs or no clusters at all are provided.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures). Integrated circuit embodiments may be fabricated using substrates and processes such as silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. An integrated circuit (IC), comprising
a first stack comprising stacked FETs proceeding from a bottom FET of the first stack to a top FET of the first stack; the stacked FETs of the first stack being stacked on top of each other in a source to drain arrangement; and
a second stack comprising stacked FETs proceeding from a bottom FET of the second stack to a top FET of the second stack, the second stack neighboring the first stack, the stacked FETs of the second stack being stacked on top of each other in a source to drain arrangement,
wherein
each FET of the first stack or the second stack has a FET width extending in a top-to-bottom or bottom-to-top direction of the first stack or the second stack;
FET widths of upper FETs of the first stack are smaller than FET widths of lower FETs of the first stack, and
the FET widths of the upper FETs of the first stack and the FET widths of the lower FETs of the first stack are configured to have the upper FETs of the first stack having a positive capacitive compensation effect with the second stack and the lower FETs of the first stack having a negative capacitive compensation effect with the second stack.

2. The IC of claim 1, wherein
the FET width of each FET of the upper FETs is smaller than the FET width of each FET of the lower FETs.

3. The IC of claim 2, wherein
the first stack comprises i) a top third of stacked FETs including the upper FETs and ii) a bottom third of stacked FETs including the lower FETs, and
the FET width of each FET of the top third of stacked FETs is smaller than the FET width of each FET of the bottom third of stacked FETs.

4. The IC of claim 2, wherein
the first stack comprises i) a top half of stacked FETs including the upper FETs and ii) a bottom half of stacked FETs including the lower FETs.

5. The IC of claim 4, wherein
width distribution of FET widths in the top half of stacked FETs is a non-decreasing width distribution in a top-to-bottom direction along the first stack, wherein at least one of the FETs of the top half of stacked FETs has a width smaller than at least one lower FET of the FETs of the top half of stacked FETs.

6. The IC of claim 4, wherein
the bottom half of stacked FETs includes i) a bottom half upper set of FETs and ii) a bottom half lower set of FETs and
FETs of the bottom half upper set have a non-decreasing width distribution in the top-to-bottom direction of the first stack, wherein at least one of the FETs of the bottom half upper set has a width smaller than at least one lower FET of the FETs of the bottom half upper set.

7. The IC of claim 6, wherein
FETs of the bottom half lower set have a non-increasing width distribution in the top-to-bottom direction of the first stack, wherein at least one of the FETs of the bottom half lower set has a width larger than at least one lower FET of the FETs of the bottom half lower set.

8. An RF switch circuit comprising the IC of claim 1, the first stack being a first switch stack and the second stack being a second switch stack.

9. An integrated circuit (IC), comprising
a first stack comprising stacked FETs proceeding from a bottom FET of the first stack to a top FET of the first stack; the stacked FETs of the first stack being stacked on top of each other in a source to drain arrangement, and
a second stack comprising stacked FETs proceeding from a bottom FET of the second stack to a top FET of the second stack, the second stack neighboring the first stack, the stacked FETs of the second stack being stacked on top of each other in a source to drain arrangement,
wherein
each FET of the first stack or the second stack has a FET width extending in a top-to-bottom or bottom-to-top direction of the first stack or the second stack;
FET widths of upper FETs of the first stack are smaller than a FET width of at least a first lower FET of the first stack, and
the FET widths of the upper FETs of the first stack and the FET widths of the at least the first lower FET of the first stack are configured to have the upper FETs of the first stack have a positive capacitive compensation effect with the second stack and lower FETs of the first stack have a negative capacitive compensation effect with the second stack.

10. The IC of claim 9, wherein
the FET width of the at least first lower FET of the first stack is smaller than the FET width of at least a second lower FET of the first stack.

11. The IC of claim 9, wherein
the FET width of the lower FET of the first stack is smaller than the FET width of at least a first upper FET of the first stack.

12. The IC of claim 11, wherein
the FET width of the at least first upper FET of the first stack is smaller than the FET width of at least a second upper FET of the first stack.

13. An RF switch circuit comprising the IC of claim 11, wherein the first stack constitutes a first switch stack and the second stack constitutes a second switch stack.

14. The IC of claim 9, wherein
the first stack comprises i) a top half of stacked FETs including the upper FETs and ii) a bottom half of stacked FETs including the at least first lower FET.

15. The IC of claim 14, wherein
width distribution of FET widths in the top half of stacked FETs is a non-decreasing width distribution in a top-to-bottom direction along the first stack, wherein at least one of the FETs of the top half of stacked FETs has a width smaller than at least one lower FET of the FETs of the top half of stacked FETs.

16. An RF switch circuit comprising the IC of claim 14, wherein the first stack constitutes a first switch stack and the second stack constitutes a second switch stack.

17. An RF switch circuit comprising the IC of claim 9, wherein the first stack constitutes a first switch stack and the second stack constitutes a second switch stack.

18. The IC of claim 9, wherein
the first stack comprises i) a top third of stacked FETs including the upper FETs and ii) a bottom third of stacked FETs including the at least first lower FET, and
the FET width of each FET of the top third of stacked FETs is smaller than the FET width of each FET of the bottom third of stacked FETs.

* * * * *